United States Patent [19]

Norberg et al.

[11] 4,309,673
[45] Jan. 5, 1982

[54] DELAY LOCK LOOP MODULATOR AND DEMODULATOR

[75] Inventors: Gayle R. Norberg, Columbia Heights; Dennis M. Petrich, Wayzata, both of Minn.

[73] Assignee: Control Data Corporation, Minneapolis, Minn.

[21] Appl. No.: 129,056

[22] Filed: Mar. 10, 1980

[51] Int. Cl.³ .......................... H03C 3/00; H03D 3/00
[52] U.S. Cl. .................................... 332/16 R; 329/50; 329/110; 329/168; 332/29 R
[58] Field of Search ............... 332/9 R, 9 T, 14, 16 R, 332/16 T, 29 R; 329/50, 103, 104, 105, 107, 110, 168, 122; 455/42, 110, 205, 214, 337

[56] References Cited

U.S. PATENT DOCUMENTS

3,221,260  11/1965  Henrion ........................ 329/168 X
3,393,380   7/1968  Webb et al. .................. 332/29 R X
4,042,884   8/1977  Querry ............................. 329/122
4,137,503   1/1979  Ziesmer .......................... 328/155

*Primary Examiner*—Siegfried H. Grimm
*Attorney, Agent, or Firm*—William J. McGinnis; Joseph A. Genovese

[57] ABSTRACT

A delay lock loop has a fixed delay element, means for detecting the edge transitions of pulses, analog or digital feedback means related to the timing differences between the edge transitions of a pair of pulses and a variable delay means responsive to the feedback means for adjusting the timing differences between a pair of pulses in response to the feedback signals. In the analog embodiment, the feedback may be a voltage related feedback with a varying voltage controlling a voltage responsive variable delay means. In the digital embodiment, the feedback means may use a counter responsive to signals from an edge detecting flip-flop and the counter may control a programmable delay means.

3 Claims, 10 Drawing Figures

DELAY LOCK LOOP MODULATOR AND DEMODULATOR

BACKGROUND OF THE INVENTION

This invention relates to systems for measuring, comparing or synchronizing the time differences between a pair of pulses in a pair of pulse trains or alternatively generating a pulse train in timed relationship to a given pulse train.

More particularly, this invention is shown in various embodiments having applications for measuring the time differential between pulses in a pair of pulse trains, means for providing timing signals to individual circuits at various locations within a computer, a self-adjusting delay or phase equalizing means and a frequency dependent demodulating system. The embodiments show both an analog and digital basis for operation.

The prior art known to applicant shows numerous systems involving phase locked loops. The present invention differs from a phase locked loop in that the phase locked loop is responsive to an entire pulse or the width of the pulse while the present invention responds only to the leading or, selectively, the trailing edge of a pulse. Similarly, some prior art patents show voltage generating devices based on the phase locked loop for controlling such devices as a voltage controlled oscillator. One such patent is U.S. Pat. No. 4,142,158. This patent does not anticipate the present invention, however, because the present invention does not use a voltage controlled oscillator nor a phase locked loop of the type shown in the patent. However, the art field is related because the type of problems typically solved by phase locked loops relate to the applications for the present invention. U.S. Pat. No. 4,105,932 shows a phase locked loop and a voltage controlled oscillator for the measurement purpose of generating clock signals for the calibration of an oscilloscope. However, the present invention is dissimilar from that patent. Other related patents showing phase locked loops and voltage controlled oscillators are U.S. Pat. Nos. 4,065,796 and 4,055,814. U.S. Pat. No. 4,051,440 shows a phase locked loop in a demodulator circuit.

The most relevant prior art known to applicant is believed to be U.S. Pat. No. 4,137,503 which shows a system for varying a time delay in a clock signal by a time determined by a voltage controlled phase correction input. However, the invention shown in that patent does not provide for phase comparison or correction in the way provided by the present invention. The present invention provides a feedback loop which is not found in the patent. Advantages of the present invention over the device shown in the patent can clearly be found in the way the devices operate. The patented invention in response to a frequency variation or drift will cause a phase detector to produce a correction signal causing a change in the delay signal but this correction will be erroneous and produce an incorrect correction. Thus, the circuit shown in the patent will be sensitive to frequency variations in a way which will not occur with the present invention.

In general, the prior art devices for performing functions similar to the applications of the present invention involve phase locked loops which are sensitive to pulse width. Such devices often respond inappropriately to changes in frequency or to changes in pulse width where the operation of the device is not intended to change in response to pulse width or in response to changes in frequency. The present invention provides a system which does not have an undesirable response to changes in frequency or to changes in pulse width. The delay lock loop of the present invention is not a true phase locked loop type of circuit. Because of the present inventions's use of either leading or trailing edge transitions on pulses, it is believed that the present invention of a delay lock loop has a separate standing in the art from that of the phase locked loop. It is believed, however, that the phase locked loop art is relevant because the applications are similar to that of the present invention.

SUMMARY OF THE INVENTION

The present invention shows a delay lock loop in various embodiments and applications all related to a basic underlying concept. A delay lock loop can have either a single input for a pulse train and provide an output having a pulse train in timed relationship to the input pulse train or alternatively have a pair of inputs for a pair of pulse trains, at the same frequency, and produce an output signal having a relationship to the time differential between the pulse trains. The present invention uses an edge transition detection means whereby leading edges of the input pulse trains may be compared, the trailing edges of the input pulse trains may be compared or the leading edge of one pulse may be compared to the trailing edge of the other pulse train. In any event, the system is essentially independent of a simultaneous change in frequency of the two pulse trains or changes in the width of the pulses in the pulse trains. This is as a result of the fact that the pulse edge transitions are the controlling element of the circuits patterned after the present invention. Thus, the present invention may operate in some ways analogous to a phase locked loop or to systems using a phase detector but, in fact, it is believed that the present invention has an independent standing in the art as a delay lock loop because of the way in which pulse edges are used.

In one embodiment of the invention, a first input pulse train is input through a pulse shaper, a fixed delay device, and an edge detecting D-type flip-flop.

A second input is provided through pulse shaping circuitry to a variable delay device and finally to the second input of the D-type flip-flop. The output of the D-type flip-flop is a signal based on the time interval between the edge transition of the first input and edge transition of the second input. This signal may be used in either an analog or digital feedback loop to control a variable delay device.

In the analog feedback embodiment, the output of the edge detecting flip-flop is passed through a filter and constitutes a feedback signal. This feedback signal is a voltage which varies depending on the time that the D-type flip-flop is on between the edge transitions of the first and second input signal to provide a voltage. This feedback signal consisting of a varying voltage is provided as a feedback to control the variable delay device in the second input. This embodiment of the invention may be used to measure the time differential between pulses in a pair of pulse trains. Other embodiments of the present invention have applications based on using the variable voltage output derived from the edge detecting D-type flip-flop to control a pulse train in various ways.

In the digital embodiment of the feedback system, a counter responds to the output pulse of the flip-flop to provide a control signal to a digital programmable delay device. This embodiment may be used with the same application as the analog feedback embodiment.

In the Figures:

FIG. 1 is a circuit diagram of one embodiment of the present invention forming a time differential delay meter.

FIG. 8 is a graph showing the phase-frequency characteristics of an embodiment of the present invention.

DESCRIPTION OF THE PREFERRED EMBODIMENTS

Referring now to FIG. 1, an embodiment of a delay lock loop according to the present invention is provided as a time differential delay meter 10. A first, or A input 12, is provided. A second or B input 14 is also provided. Input 12 is connected to a differential amplifier 16 which shapes the input pulse so that it has a smooth characteristic and does not cause false activation of the circuit. A second amplifier 18 is provided in association with a transmission line 20 of a predetermined length so that a pulse traveling through line 20 has a predetermined time delay. Any other fixed time delay device may be used within the scope of the invention. Line 20 is also labeled line A in the figure. Line 20 is connected to a first or data input on a D-type flip-flop 22 which forms an edge transition detection means and acts in a way analogous to a phase detector although it is not identical to a phase detector. D-type flip-flop 22 is also an edge transition flip-flop and the sawtooth symbol on the flip-flop is used to indicate that as a matter of standard symbol notation. It is possible to constitute this embodiment of the present invention to operate on the leading edges of both the A and B pulse trains or on the trailing edges of both pulse trains or on the leading edge of one pulse train with respect to the trailing edge of the other pulse train.

The B input 14 is connected to a differential amplifier 24 which provides pulse shaping and smoothing for the B pulse train. The output of amplifier 24 is connected to a variable delay device 26 which has an output through a fixed length transmission line 28, also labeled line B in the figure. Line 28 is connected to a second or clock input of D-type flip-flop 22. For purposes of this embodiment of the present invention; line B should be of a slightly different length than line A. Outputs 30 and 32 corresponding to the respective states of the D-type flip-flop are connected to a voltage divider network comprised of resistors 34 and 36 from which a single voltage output 38 is derived at the center thereof. Resistors 40 and 42 provide termination for device 22. A feedback loop is connected from termination 38 in the voltage divider network by way of line 44 through an elementary filter 46 to line 55 and then to the center tap between a pair of resistors 48 and 50. Filter 46 is merely provided to ensure that line 44 has a direct current voltage thereon without various voltage spikes caused by switching of the D-type flip-flop.

Resistor 50 is connected through a variable resistor 52 to bus 54 which provides a fixed voltage reference to delay device 18 and to both differential amplifiers 16 and 24. Another elementary filter 56 is provided with respect to bus 54 to ensure that only direct current is present. Resistor 48 is connected to an input of variable delay device 26 and comprises a filter in combination with capacitor 58 at that input.

A device 60 receives a first input from line 44 and a second input from bus 54. The output of device 60 is used to drive a first switch 62 and a second switch 64. Switch 62 controls light emitting diode 66 while switch 64 controls light emitting diode 68. Device 60 controls switch 62 in one state or condition and switch 64 in its other state or condition to provide an indication of which state or condition device 60 is in.

The operation of the circuit according to FIG. 1 will now be explained. The negative transition of input pulse trains on the A and B inputs are measured and presented as a direct current voltage output at a pair of terminations 70 and 72 for measurement purposes. Variable resistor 52 is used to adjust the calibration of the output so that the phase difference between the input pulse trains may be directly measured in time units. Naturally, the output may be displayed on an oscilloscope for example.

Input pulse shaping circuits 16 and 24 shape the input pulses to a smooth shape for measurement purposes and control purposes of the D-type flip-flop and also transform the voltage reference to that reference voltage appropriate to the circuit. This reference voltage is derived from the reference voltage on bus 54 which is connected to the various elements of the circuit.

Delay device 18 in combination with transmission line 20 simply introduces a constant delay in the pulses provided to the data input of D-type flip-flop 22 so that the adjustment of the delay or reference of the delay through the other channel in the circuit may be both positive and negative. Without a fixed delay in the A channel, delay measurement could not be bilateral. If adjustment in only one direction was desired, this fixed delay would be eliminated.

Referring now to the B channel signal as applied to device 26, the feedback voltage developed by the D-type flip-flop 22 is provided to the inverting input 73 and then is connected to the clock input of the D-type flip-flop 22.

The negative going edge of pulses on the B channel received at input 14 at the clock input to flip-flop 22 causes the pulse on the A channel to be clocked into the flip-flop 22. Capacitor 74 is connected between reference ground and line 28 and is adjusted to calibrate the circuit so that there is zero output when pulses of zero phase differences are connected to the A and B input lines. Flip-flop 22 has a Q and not Q output previously described as outputs 30 and 32. The feedback voltage on line 55 is developed by the toggling, or switching, of the Q and not Q outputs of the flip-flop 22. The unfiltered voltage on line 44 which is filtered by filter 46 provides a variable voltage on line 55 which controls the threshold level at which device 26 output toggles or switches with respect to the input level on the positive input of device 26. The amount of time delay in a signal passing through variable delay device 26 is equal and opposite in magnitude to the delay between edge transitions on pulses in channels A and B. The amount of delay change through variable delay device 26 is dependent on the input reference level of device 26 input pulse, the slope of the input transition and the amount of difference between Vbb and the feedback voltage 55.

The delay control circuit formed by variable delay device 26 and flip-flop 22 causes the feedback voltage on line 44 to go low when the not Q output at 32 is low. A low output on the not Q termination of device 22 indicates the clock input of device 22 was early with respect to the data input on device 22. The going low transition voltage feedback to the variable delay device 26 causes the delay through device 26 to increase. This increase in voltage, if sufficient, will delay the clock signal enough to cause the clock input to fall behind the data input at device 26, thus setting the not Q output at 32 of device 22 to a high output. The high output at termination 32 will cause feedback to variable delay device 26 and decrease the clock signal path delay time. The average value of the filtered feedback on line 55 provided to device 26 is dependent on the amount of time the not Q output of flip-flop 22 is in the high and in the low state. The maximum change in voltage for the filtered feedback is a ratio of resistor 34 to resistor 36. Resistor 34 and resistor 36 limit the feedback voltage swing caused by flip-flop 22 to be the linear portion of the input transition voltage level to amplifier 26 and to prevent latch-up or locking up of the flip-flop 22 if the A channel input is removed. Reference should also be had to FIG. 8 for further understanding of this operation.

Feedback voltage on line 44 is filtered first by the resistor capacitor combination of filter 46 and also by the resistor capacitor combination formed by resistor 48 and capacitor 58 to smooth the switching transitions of the output voltage of the flip-flop 22 to provide a direct current level to the inverting input of variable delay device 26. The time constant of this filtering arrangement determines the lowest repetition rate which can be compared in pulse trains at the A and B inputs. The filter time constant also determines the speed at which a measurement output can be accurately determined. Obviously, these filter elements will be selected to provide as fast a response time as is desirable which is consistent with providing a sufficiently filtered direct current level so that the circuit operates properly.

The light emitting diodes 66 and 68 are controlled by device 60. Device 60 compares the unfiltered feedback level from line 44 ahead of filter 46 with the reference voltage level on bus 54 which is provided at the inverting input thereof. If the feedback voltage level is more positive than the reference voltage level, then this is an indication that flip-flop 22 feedback is acting to decrease the delay through device 26 because the B channel input signal is arriving later than the A channel input signal. This condition will light the "long" light 68 while the opposite condition will light the "short" light 66.

If the flip-flop 22 and delay device 26 combination is able to correct for differences in phase or more correctly in terms of the present invention, time differential, between the A and B channel inputs, both the long and short lights 66 and 68 will be on indicating that the time differential delay meter in this embodiment is locked on the input signal and that a measurement is available at output termination 70 and 72. When the time differential between the A and B channel input is greater than the range of the circuit, then the long or short light will remain on while the other light will remain off. This is an indication that no output can accurately be derived. The lighting of only one signal light indicates phase difference between the A and B channels is greater than the range of the circuit. Devices 62 and 64 are current sources used to operate the lights.

Resistor 50 and variable resistor 52 constitute a voltage divider circuit which can be used to calibrate the output of the circuit to provide a convenient relationship between time intervals and voltage intervals. The ratio of resistor 50 to resistor 52 is a function of the transition time of device 26 and the number of individual feedback controlled circuits in the B channel. For example, the circuit may be designed to show the relationship of one picosecond to 0.1 mV. Thus, if the circuit elements are provided appropriately, then the circuit may be calibrated to that dimension.

Figure 2:
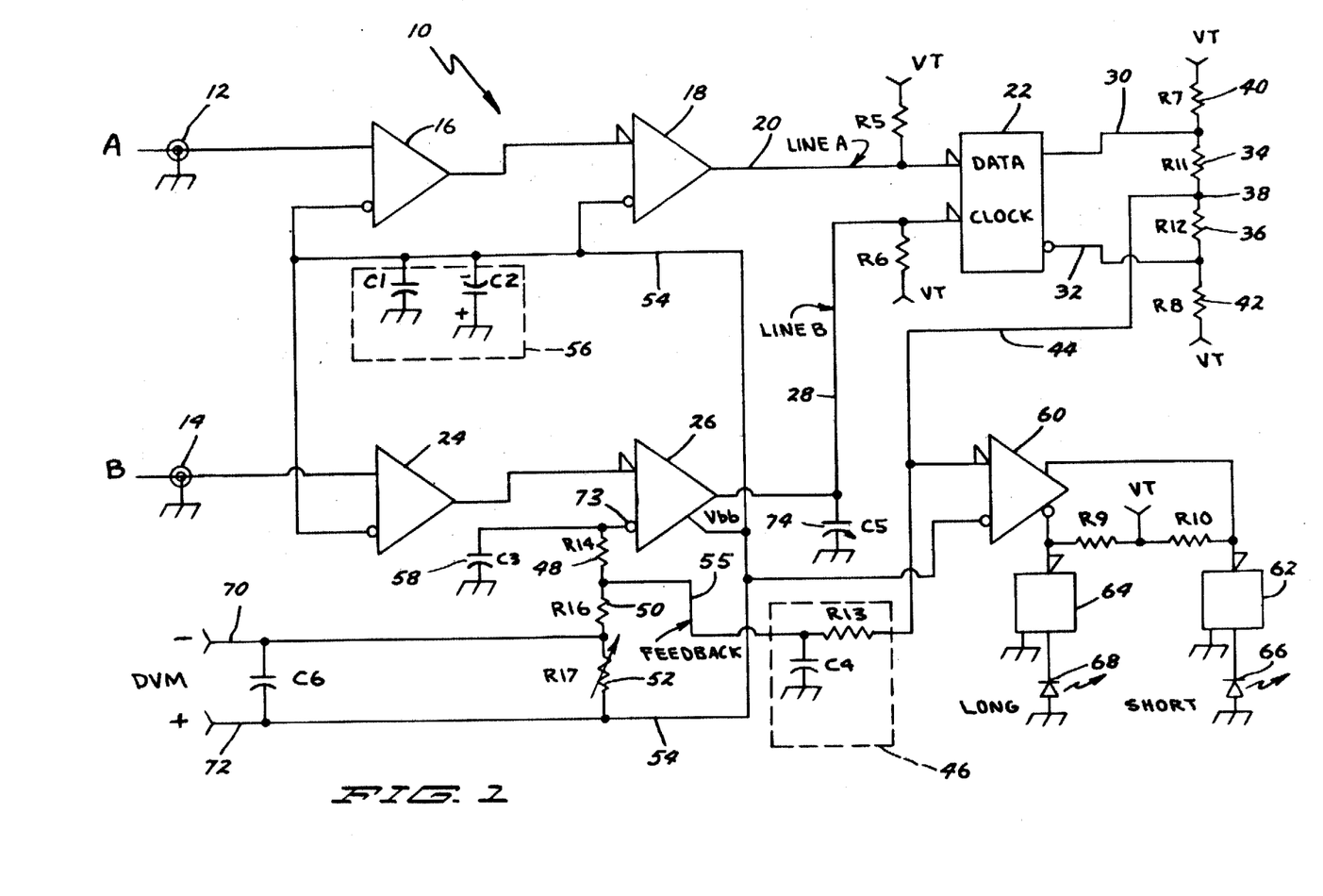
FIG. 2 is a time domain waveform diagram showing the operation of the embodiment of the present invention shown in FIG. 1.

Referring now to FIG. 2, the waveforms are shown in the time domain and are labeled with respect to FIG. 1. The figure is self-explanatory with respect to showing the operation of the circuit in response to edge transitions on pulses in the A and B channels to provide increasing or decreasing delays through the delay channel device 26.

Figure 3:
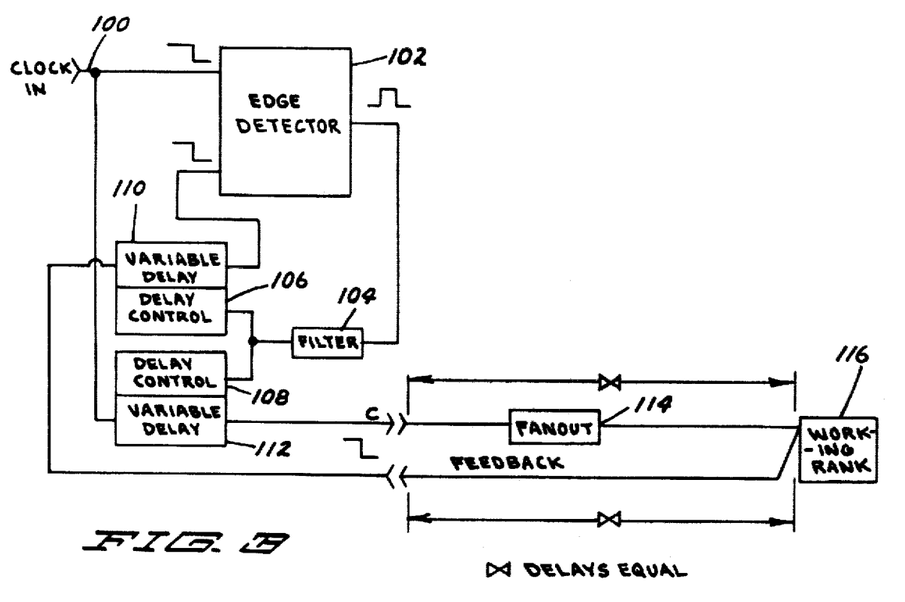
FIG. 3 is another embodiment of the present invention showing in schematic form a self-adjusting phase equalizer.

Referring now to FIG. 3, another embodiment of the present invention is shown. A clock input signal is received at input 100 and is provided to the data input of an edge transition flip-flop 102 similar to that of flip-flop 22 as shown in FIG. 1. The feedback output of flip-flop 102 is passed through a filter 104 to a pair of delay control devices 106 and 108 of the same type provided by device 26 as shown in FIG. 1. Delay control 106 controls variable delay 110 in a transmission path while delay control 108 controls a variable delay in a transmission path 112. The clock input signal 100 is connected through variable delay path 112 through a fan-out system 114 to the various operating ranks at various locations in a computer. This is represented generally by box 116. Time related feedback from individual working ranks is provided through a transmission line of exactly the same length to have the same time delay as the time delay through the transmission lines on feedback network 114 in providing the clock signals to the working ranks of the computer. The feedback signal 118 is provided to variable delay channel 110 and provides the clock input to flip-flop 102.

The device of FIG. 3 works in the following fashion. A self-adjusting phase equalizer is formed for use in a computer system using an edge transition flip-flop 102 in a way analogous to a phase detector. Phase shift from a clock source to various individual working ranks in a computer undergo phase shift if the basic clock frequency changes in a high clock rate computer system. Clock frequency changes are made in order to test the clock frequency margins of the computer with respect to the individual working ranks of the computer which are controlled by a master clock oscillator. The phase equalizer of FIG. 3 corrects for all oscillator frequency changes within the operating range of the variable delay transmission paths. Phase shifts as detected at the working rank 116 due to changes in the clock time delay through the fan-out system 114 are significantly reduced using this circuit. Both the clock delay in the fan-out and in the feedback path are variable. A correcting voltage generated by the edge transition flip-flop 102 as passed through filter 104 changes the time delay in both delay elements to maintain a constant phase relationship in all clock circuits.

Figure 4:
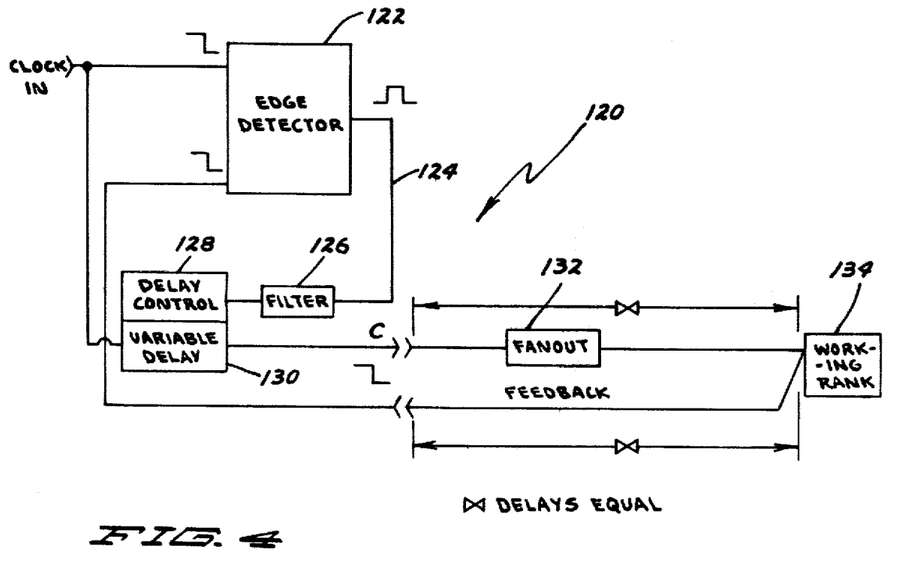
FIG. 4 is another embodiment of the present invention in diagrammatic form showing a self-adjusting delay device.

Referring now to FIG. 4, a self-adjusting delay circuit 120 according to the present invention is shown. An edge detection flip-flop 122 receives a clock input signal on the data input channel. The voltage related output is passed through line 124 to a filter 126 to provide a direct current to a delay control device 128. The clock input source is connected through the variable delay channel 130 controlled by the delay control 128 to a fan-out system for a computer clock control system. The working rank of the computer is referenced as 134. Feedback from the working rank is provided through an equal time delay channel to the clock input of flip-flop 122. This circuit of FIG. 4 is a delay lock loop configured as a self-adjusting delay for deskewing the clock fan-out in a computer system. Clock fan-out skew can occur due to integrated circuit chip aging, replacement of chips, replacement of circuit boards, changes in cabling, and other factors relating to aging and operation of the computer system. Circuits of the type shown in FIG. 4 can correct for all phase differences within the range of the variable delay device 130 and can also compensate for changes in clock frequency. The edge detecting flip-flop provides a correction signal voltage which is filtered by filter 126 and connected to delay control device 128. The correction voltage occurs if the signal phase at the data and clock inputs of the flip-flop 122 are not equal. If there is a phase difference, the delay control 128 corrects the delay by adjusting the variable delay device 130 until the phase at inputs to the flip-flop 122 are equal. Because the working rank 134 is halfway between the delay control 128 and the phase detector 122, clock frequency changes in phase are reduced by a factor of 2.

Figure 5:
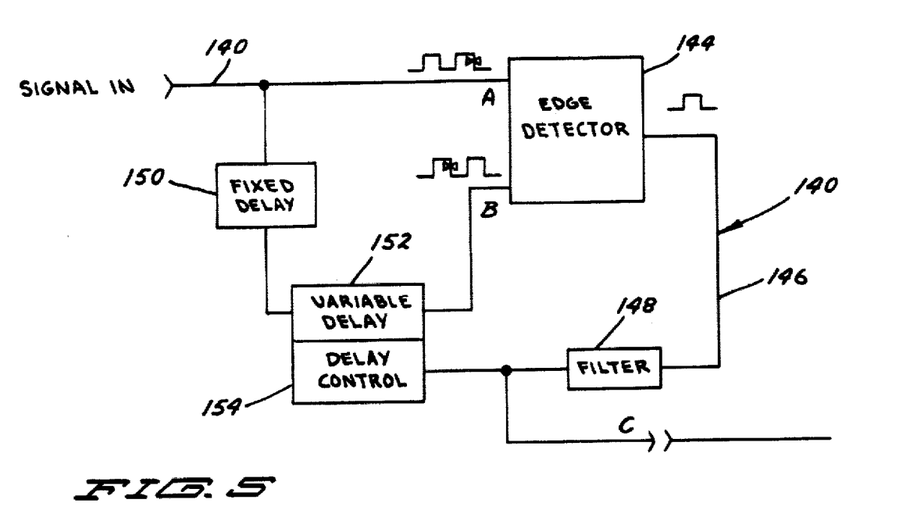
FIG. 5 is another embodiment of the present invention showing in diagrammatic form a single input frequency dependent demodulator.

Referring now to FIG. 5, a single input frequency dependent demodulator embodiment 140 of the delay lock loop is shown. An input signal is provided on line 142 and provided to the data input to an edge transition flip-flop 144 which has an output correction voltage on line 146 which is passed through a filter 148. Input signal 142 is also passed through a fixed delay device 150 which may be simply a length of transmission cable to a variable delay channel 152 and finally to the clock input of the flip-flop 144. A delay control device 154 controls the operation of variable delay device 152 and is controlled by the voltage output from filter 148. An output from filter 148 is provided as the circuit output in which phase shifts in input signal 142 have been converted to amplitude shifts in the filtered signal for amplification or measurement. These phase shifts are created artificially by the fixed delay device 150 so that phase shifts in the input signal can be detected. Flip-flop 144, operating in a way analogous to a phase detector, locks onto a delayed cycle of the input pulse train at the data input A of the flip-flop. This is shown by the notch symbol on the transition of the signal. Point B, the clock input of the flip-flop is locked on either the leading or trailing edge of the input pulse train with respect to the signal at the data input A. However, the delay in the clock input at input B is shown by use of the symbol on a later pulse in the pulse train to show the time delay.

Figure 6:
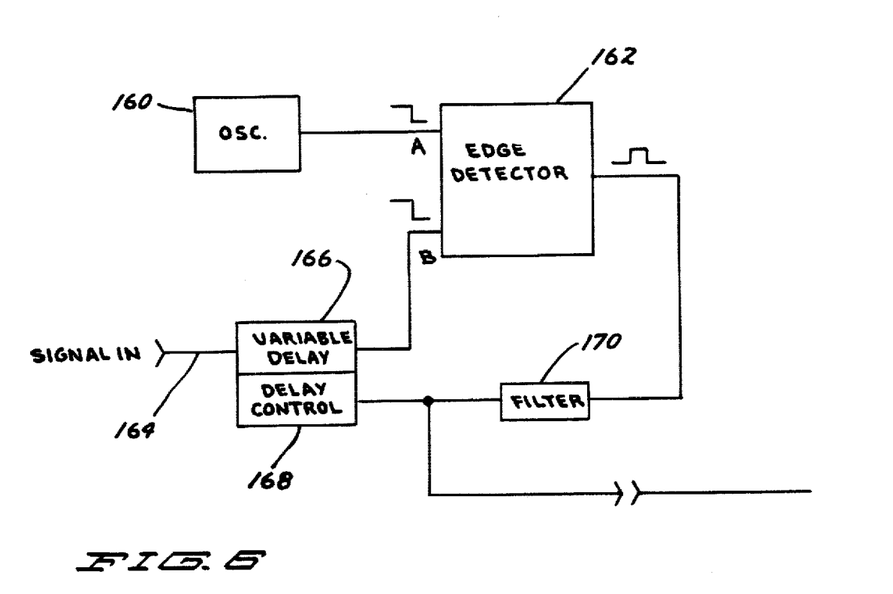
FIG. 6 is another embodiment of the present invention showing in diagrammatic form a dual input frequency dependent demodulator.

Referring now to FIG. 6, another embodiment of the present invention is shown in which a delay lock loop is formed as a dual input frequency dependent demodulator. A reference oscillator 160 provides an input pulse train to an edge detecting flip-flop 162 operating in a way analogous to a phase detector. Input signal is provided at input line 164 through a variable delay channel 166 to the clock input of flip-flop 162. Variable delay channel 166 is controlled by a delay control 168 which receives a feedback signal through filter 170 from the voltage output of flip-flop 162. An output of filter 170 provides a voltage output in which phase shifts with respect to the reference oscillator 160 of input signal 164 are converted to voltage amplitude shifts for measurement or detection purposes. Thus, the reference signal input at 164 may be controlled to lock on the oscillator frequency 160.

Figure 7:
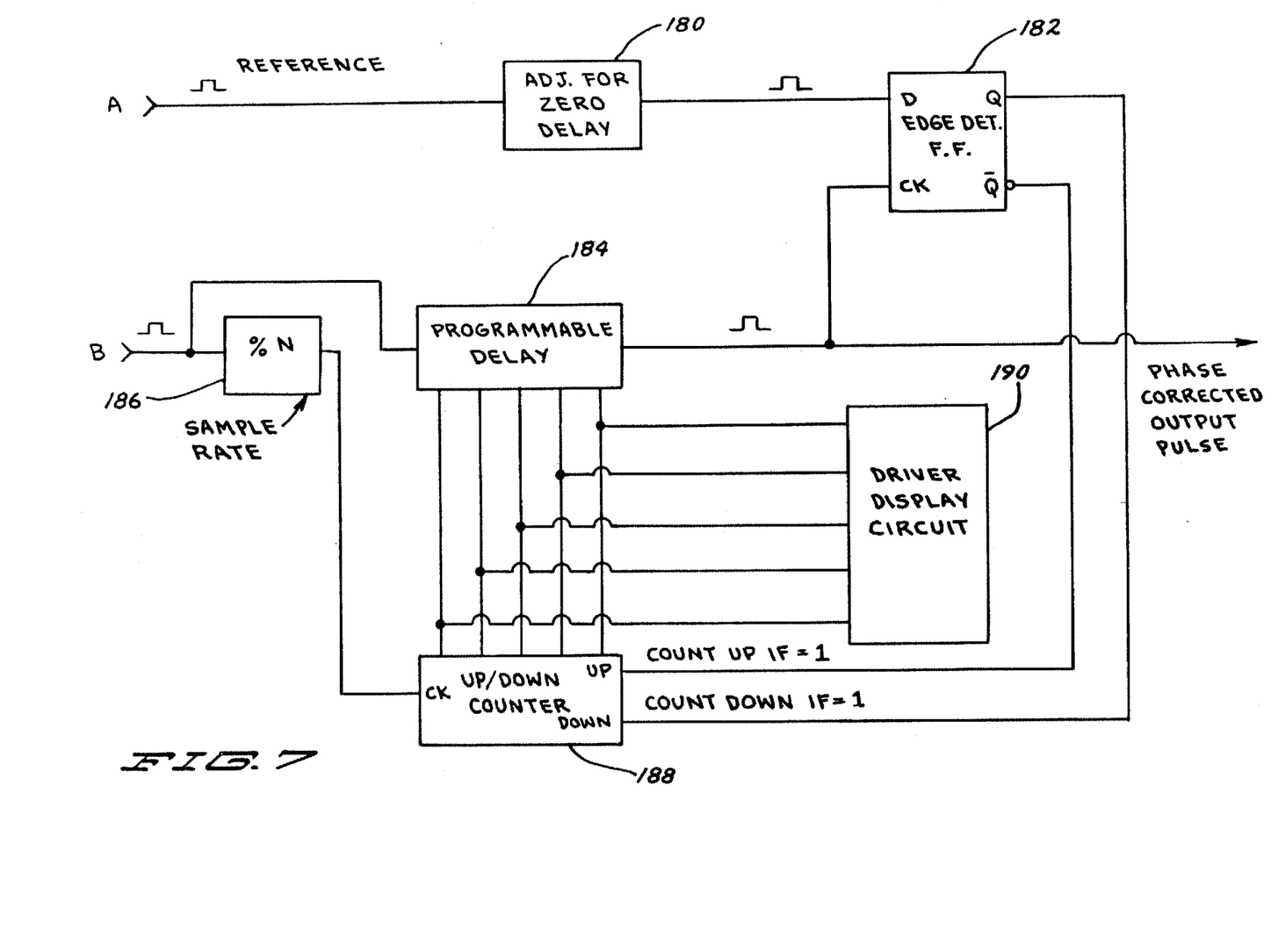
FIG. 7 is a further embodiment of the present invention in which digital feedback means controls operation.

Referring now to FIG. 7, another embodiment of the delay lock loop circuit is shown in which the feedback system is provided by digital means. The A channel reference signal is input to an adjustable delay network 180 which is adjusted to zero the circuit. The output from the adjustable delay circuit 180 is connected to the data or D input of edge detecting flip-flop 182. A programmable delay circuit 184 provides an input to the clock or C input of edge detecting flip-flop 182 and this also becomes the phase corrected output pulse of the circuit. The B channel input to the device is provided to both the programmable delay network 184 and the sample rate device 186. The sample rate device 186 has an output connected to the input of up-down counter 188. The up-down counter 188 is, in turn, connected with the programmable delay 184. A driver display circuit 190 monitors the output of the up-down counter as connected to the programmable delay device 184. The output of the edge detecting flip-flop is provided as an input into the up-down counter 188. The Q output of the edge detecting flip-flop causes a down count if it is one while the not Q output of the flip-flop 182 causes an up count if one. The theory of operation of this embodiment of the invention is similar to that where the feedback means is analog except that, of course, the feedback system is a digital feedback means.

To zero adjust the digital delay lock loop embodiment of FIG. 7, signals are provided to the A and B channel inputs with a zero phase difference and the adjustable delay device 180 is adjusted for zero indication on the display device 190. This can be set to be in the middle of the programmable delay device 184 range if both positive and negative delay correction is desired or at either end of the range if only correction in one direction is desired.

If the D input of the flip-flop 182 is high at the time the clock input is received, the flip-flop will set placing a binary one at the down count enable on counter 188 and a binary zero at the up count enable. At the next B channel signal edge, the counter will down count reducing the delay through the programmable delay device by one time period. Once the signal has propagated through the programmable delay 184 to the clock input of the flip-flop 182, which is at a time earlier than before, the B input is again detected. If the D input to the flip-flop is still a high on the next B channel signal, the counter counts down one more time period and reduces the programmable delay to cause the B channel signal to occur at an earlier time period. The delay through the programmable delay device 184 will keep reducing until at clock time in the flip-flop 182 the data input D is low. At that time, the flip-flop will clear, placing a binary one on the up count control input and a binary zero at the down count input enabling the counter to be up counted on the next B channel signal input. In this case, the programmable delay device 184 will be increased by one count. At this time, the digital delay lock loop is locked on the B channel signal and the edge detecting flip-flop 182 will toggle between set and clear causing the up-down counter 188 to increase and decrease the delay through the programmable delay 184 by one time unit. The output of the up-down counter can now be processed or displayed as the phase difference between A and B channel input signals or the output from the programmable delay can be used to drive other circuits. The digital delay lock loop embodiment can be used in all of the same configurations as the analog delay lock loop as shown in FIGS. 1 through 6. The circuit as shown in FIG. 7 compares the A and B channel input leading edges if the edge detecting flip-flop 182 is a leading edge triggered D-type flip-flop. Similarly, the trailing edge may be detected if desired, or the circuit may be configured so that the leading edge of an A channel is detected while the trailing edge of the B channel is detected or vice versa.

There are several significant differences between the delay lock loop and figuration of FIG. 7 and that of FIGS. 1 through 6. Primarily, there is no analog feedback voltage. There are no low frequency locking limitations. Of course, a digital voltmeter is not required to measure feedback voltage. The delay inserted in the B channel line is digitized for display or processing purposes in further devices. The up-down counter and programmable delay feedback circuit comprises a memory delay feedback circuit. In the absence of a B channel signal, no correction occurs. Delay through the programmable delay does not change. When a B channel signal does occur, the first pulse will be phase corrected as long as its phase relationship with the A channel signal has not changed. No pulse narrowing or change of pulse shape occurs with the corrected output signal.

Referring now to FIG. 8, a frequency phase relationship graph is provided which graphically explains the features of the delay lock loop as shown in FIG. 1 and which serves to distinguish if from the characteristics of a phase lock loop circuit.

Figure 9:
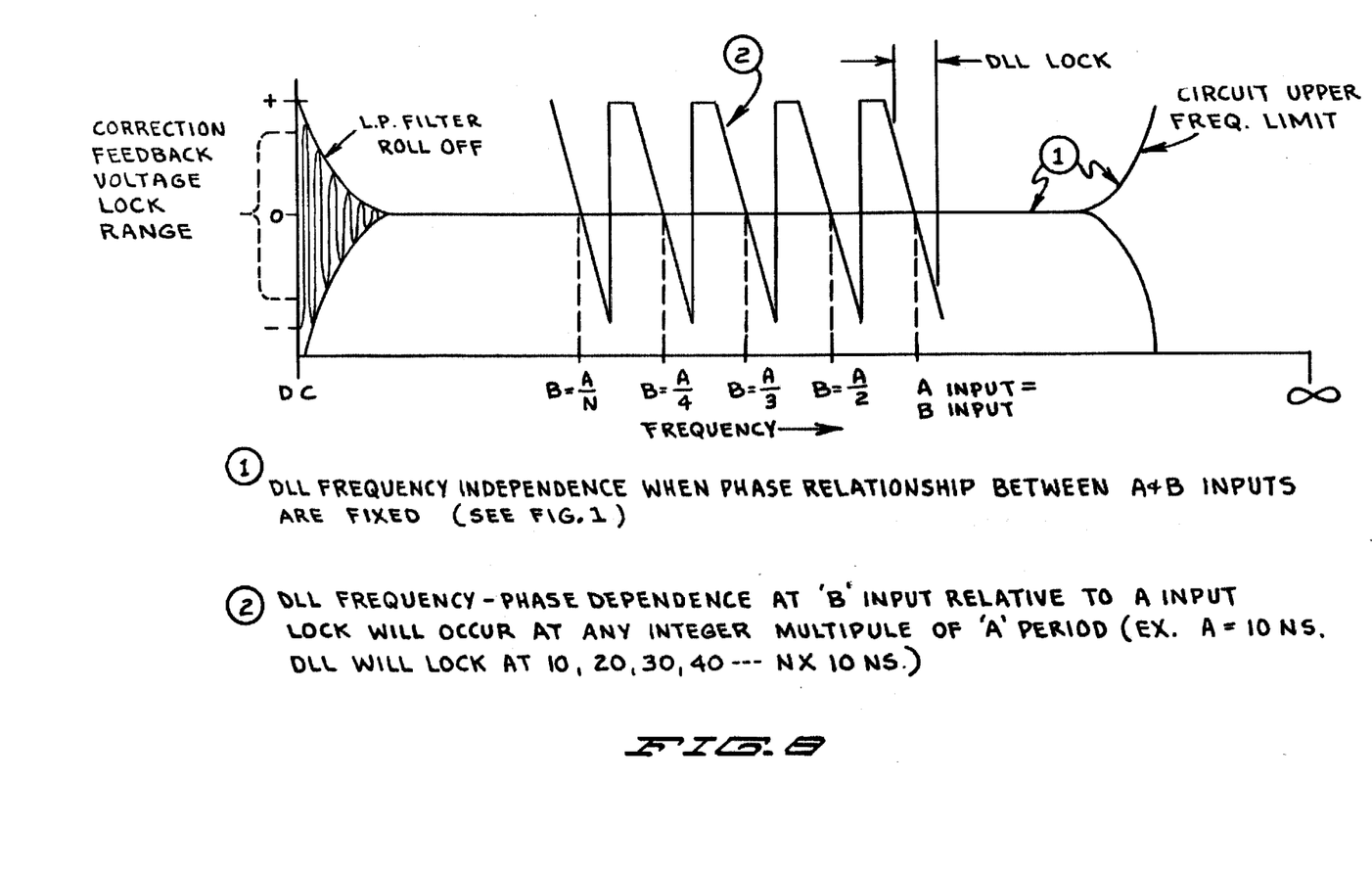
FIG. 9 is another embodiment of the present invention showing in diagrammatic form a phase modulator circuit.

Referring now to FIG. 9, showing an embodiment of the present invention in which a phase modulated signal is generated by a delay lock loop circuit, an edge detector means which may be an edge detection flip-flop 200 receives a data input signal from an oscillator 202 and provides a Q and not Q output to a voltage divider network comprised of resistors 204 and 206. The oscillator also has a transmitted output signal on line 208 which is referred to as the pilot signal. The output of the oscillator 202 is also connected as a signal source input to the variable control delay device 210 which has its output connected to the clock input of flip-flop 200. The output of the variable delay control 210 also forms the modulated signal output of the circuit after passage through a half cycle, one shot flip-flop 212 which produces the transmitted signal. The output of the voltage divider networks comprised of resistors 204 and 206 is connected to a filter 214 having a first band pass frequency characteristic. The output of filter 214 is connected as the control signal for the control element 216 for variable delay control device 210. The signal to be modulated is provided on input line 218 where it is summed together with the signal from filter 214 and provides an input signal to control device 216 for variable delay control 210.

Figure 10:
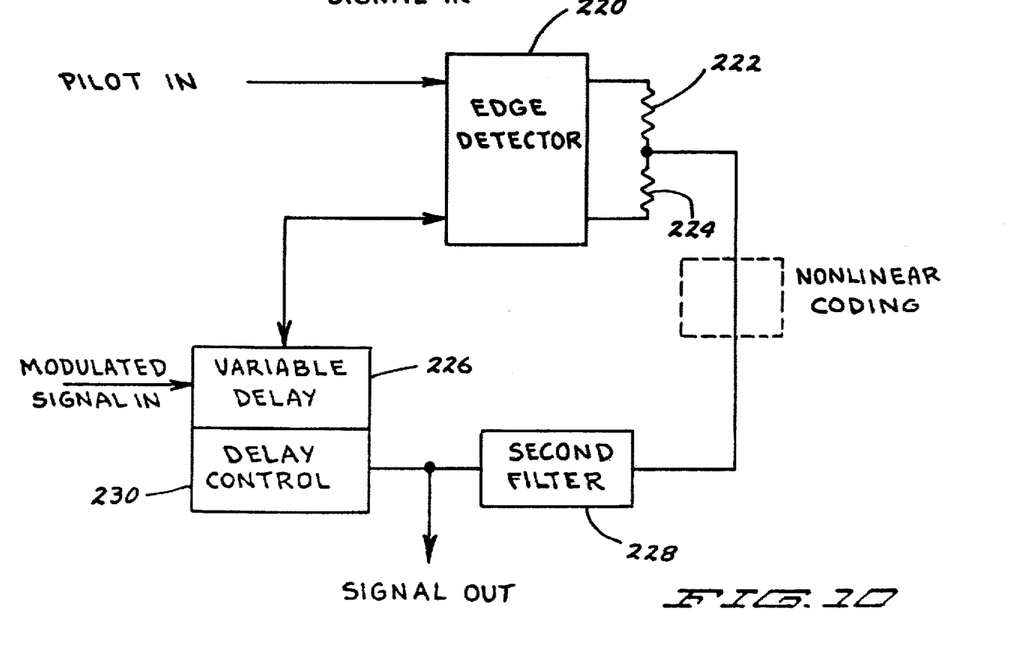
FIG. 10 is another embodiment of the present invention showing in diagrammatic form a phase demodulator circuit.

Referring now to FIG. 10, a demodulator circuit is shown for demodulating the signal generated by the embodiment of the present invention shown in FIG. 9. The pilot input signal generated by oscillator 202 in FIG. 9 is provided as the data input to an edge detector means which may be an detecting flip-flop 220 which has a Q and not Q output connected to a voltage divider network comprised of resistors 222 and 224. The phase modulated signal generated as the output of flip-flop 212 in FIG. 9 is provided as an input data signal to variable delay control 226 as shown in FIG. 10. Delay control 226 has its output connected to the clock input of flip-flop 220. The output of the voltage divider network comprised of resistors 222 and 224 is connected as an input to filter 228 having a second band pass characteristic different from that of filter 214 shown in FIG. 9. The output of filter 228 is connected with the control circuit 230 which controls the variable delay control 226. The output of filter 228 also comprises the demodulated output signal from the demodulator. It is desirable that filters 214 and 228 have completely different band pass characteristics although it is believed that the circuit would be functional if some overlap of band characteristics was to occur. For example, the filter 214 might have a frequency characteristic rolling off from direct current to attenuate at some given frequency. Filter 228 might therefore have a band pass characteristic above the predetermined frequency of the filter 214.

The pilot and modulated signal generated by the modulator of FIG. 9 may be directly connected through appropriate signal lines to the demodulator of FIG. 10 or various subcarrier relationships may be generated or the signals may be harmonically related and locked together except for the modulation deviations. Obviously many variations of conveying the two signals from the modulator to demodulator may be employed all within the scope of the communications art.

By way of explanation, the half cycle, one shot flip-flop in the modulator of FIG. 9 serves the function of stretching the phase modulated output so that the phase modulated output signals are outside the pass band of filter 214. Signals falling within the pass band range of filter 214 are rapidly attenuated or eliminated as a result of the basic operation of the delay lock loop involving flip-flop 200. It is possible to generate phase modulated signals with the embodiment of the invention shown in FIG. 9. The filter 214 does have the desirable effect of filtering out of the transmitted signal certain complements of the modulating signal falling within the pass band of the filter. Thus, the input signal to be modulated is merely added directly to the output of the filter network 214.

Using the circuit configurations of FIG. 9 and 10 but in which a digitally controlled feedback loop such as that shown in the embodiment of FIG. 7 would provide for the additional feature of data coding. This would be implemented by adding additional logic gates in the feedback loop between the flip-flop 182 and the up/-down counter 188 as shown in FIG. 7 but in a transmitter embodiment like that of FIG. 9 to insert the coding functions in the feedback loop. This could be implemented most simply by causing the variable delay counter to have a nonlinear up and down count characteristic. For example, the counter could be made to increment by one unit and decrement by two in order to provide a nonlinear coding function. Then, a receiver would be required which would have the complementary nonlinear characteristic for demodulation. Another example of modulation coding could be to increment and decrement by two units for small deviations of signal output but to increment and decrement the counter by one unit for modulating signals above a threshold level, thus distorting the information carried if a linear demodulator were used. Only a demodulator with a precise predetermined digital nonlinearity characteristic complementary to the modulator characteristic would reproduce the modulated signal accurately.

What is claimed is:

1. In combination; a modulator, a demodulator and means providing for transmission from the modulator to the demodulator, and wherein said modulator is comprised of:

an oscillator which provides a pilot signal which is transmitted to said demodulator, a pulse edge detector means for detecting the edge of an input pulse and having a first and second input and having at least one output which is indicative of a pulse edge, and wherein said first input is connected to said oscillator, a variable delay device which receives an input signal from said oscillator and has an output connected to the second input of said pulse edge detector means, said device having the characteristic of varying the delay time of signal transmission therethrough in response to a control signal, control means for said variable delay device and connected thereto and having an input for receiving an input signal to which it is responsive, a filter having a first filter characteristic connected with the output of said edge detector means and having an output connected to said control means, and wherein the signal to be modulated is added to the input signal to said control means from said filter and a half cycle one shot flip-flop means connected with the output of said variable delay device and having as its output the output signal of said modulator, and wherein said demodulator is comprised of:

a pulse edge detector means for detecting the edge of an input pulse and having a first and second input and having at least one output which is indicative of a pulse edge and wherein said first input is connected to receive said pilot signal, a variable delay device which receives an input signal from the output signal of said modulator and has an output connected to the second input of said pulse edge detector means, said device having the characteristic of varying the delay time of signal transmission therethrough in response to a control signal, control means for said variable delay device and connected thereto and having an input for receiving an input signal to which it is responsive, a filter having a second filter characteristic different from said first filter characteristic connected with the output of said edge detector means and having an output connected to said control means, and wherein the output of said filter comprises the demodulated output signal.

2. The apparatus of claim 1 wherein the first filter characteristic is a band pass range from a very low frequency up to a predetermined frequency and wherein the second filter characteristic is a band pass range of frequencies above said predetermined frequency.

3. The apparatus of claim 1 wherein the modulator causes coding of the signal to be transmitted and further comprising a nonlinear coding means connected between the output of said edge detector means and said first filter and wherein coding signals are added to the output of said edge detector means.

* * * * *